United States Patent
Kim et al.

(10) Patent No.: US 8,865,023 B2
(45) Date of Patent: Oct. 21, 2014

(54) (HALO)SILICATE-BASED PHOSPHOR AND MANUFACTURING METHOD OF THE SAME

(75) Inventors: Chang Hae Kim, Daejeon (KR); Hwa Sung You, Daejeon (KR); Kang Sik Choi, Daejeon (KR)

(73) Assignee: Korea Research Institute of Chemical Technology, Daejeon (KR)

( * ) Notice: Subject to any disclaimer, the term of this patent is extended or adjusted under 35 U.S.C. 154(b) by 139 days.

(21) Appl. No.: 13/499,129

(22) PCT Filed: Sep. 3, 2010

(86) PCT No.: PCT/KR2010/006001
§ 371 (c)(1),
(2), (4) Date: Mar. 29, 2012

(87) PCT Pub. No.: WO2011/040709
PCT Pub. Date: Apr. 7, 2011

(65) Prior Publication Data
US 2012/0187338 A1   Jul. 26, 2012

(30) Foreign Application Priority Data

Sep. 29, 2009  (KR) .................. 10-2009-0092547

(51) Int. Cl.
*C09K 11/80* (2006.01)
*C09K 11/77* (2006.01)
*H01L 33/50* (2010.01)

(52) U.S. Cl.
CPC .......... *C09K 11/7792* (2013.01); *C09K 11/7734* (2013.01); *H01L 33/502* (2013.01)
USPC ............................. 252/301.4 F; 252/301.4 H

(58) Field of Classification Search
USPC ..................... 252/301.4 F, 301.4 H
See application file for complete search history.

(56) References Cited

U.S. PATENT DOCUMENTS

| | | | | |
|---|---|---|---|---|
| 3,790,490 | A * | 2/1974 | Datta et al. | 252/301.4 F |
| 6,093,346 | A * | 7/2000 | Xiao et al. | 252/301.4 F |
| 7,045,826 | B2 * | 5/2006 | Kim et al. | 257/98 |
| 7,646,141 | B2 * | 1/2010 | Kim et al. | 313/486 |
| 2006/0284185 | A1 * | 12/2006 | Kim et al. | 257/79 |
| 2007/0080363 | A1 * | 4/2007 | Kim et al. | 257/100 |
| 2007/0200095 | A1 * | 8/2007 | Murazaki | 252/301.4 H |
| 2007/0252109 | A1 * | 11/2007 | Naum | 252/301.36 |
| 2009/0050918 | A1 * | 2/2009 | Zhuang et al. | 257/98 |

FOREIGN PATENT DOCUMENTS

| | | | |
|---|---|---|---|
| JP | 56-155280 | * | 12/1981 |
| KR | 10-2002-0025696 A | | 4/2002 |
| KR | 10-2005-0031343 A | | 4/2005 |
| KR | 10-2006-0015036 A | | 2/2006 |
| KR | 10-2009-0079213 A | | 7/2009 |
| WO | WO 2008/042740 | * | 4/2008 |
| WO | WO 2008/042740 A | | 4/2008 |

OTHER PUBLICATIONS

Park, Joung Kyu et al.: "Luminescence Characteristics of $Sr_3MgSi_2O_8$:Eu Blue Phosphor for Light Emitting Diodes", *Electrochemical and Solid-State Letters*, 7 (10), 2004, H42-H43.

Poort, S.H.M. et al.: "Luminescence of $Eu^{2+}$ in silicate host lattices with alkaline earth ions in a row", *Journal of Alloys and Compounds*, 241 (1996), pp. 75-81.

Choi, Kyoung Jae et al.: "Luminescence Characteristics of $Sr_3MgSi_2O_8$:Eu Blue Phosphor for Light Emitting Diodes", *Journal of the Korean Ceramic Society*, vol. 41, No. 8, 2004, pp. 573-577. In Korean, English abstract only.

Li, Yuan Qiang et al.: Crystal, electronic and luminescence properties of $Eu^{2+}$-doped $Sr_2Al_{2-x}Si_{1+x}O_{7-x}N_x$ *Science and Technology of Advanced Materials*, 8, 2007, pp. 607-616.

* cited by examiner

*Primary Examiner* — Carol M Koslow
(74) *Attorney, Agent, or Firm* — Frommer Lawrence & Haug LLP; Roland R. Santucci

(57) ABSTRACT

Disclosed are a (halo)silicate-based phosphor and a manufacturing method of the same. More particularly, the disclosed phosphor is a novel (halo)silicate-based phosphor manufactured by using a (halo)silicate-based host material containing an alkaline earth metal, and europium as an activator.

8 Claims, 10 Drawing Sheets a.

b.

(HALO)SILICATE-BASED PHOSPHOR AND MANUFACTURING METHOD OF THE SAME

This application is a 371 of PCT/KR2010/006001 filed on Sep. 3, 2010 published on Apr. 7, 2011 under publication number WO 2011/040709 A which claims priority benefits to Korean Patent Application Number 10-2009-0092547 filed Sep. 29, 2009, the disclosure of which is incorporated herein by reference.

CROSS-REFERENCE TO RELATED APPLICATION

This application claims under 35 U.S.C. §119(a) the benefit of Korean Patent Application No. 10-2009-0092547 filed on Sep. 29, 2009, the entire contents of which are incorporated herein by reference.

BACKGROUND (a) Technical Field

The present invention relates to a (halo)silicate-based phosphor and a manufacturing method of the same.

(b) Background Art

A technology for manufacturing a white light emitting diode (LED), which has recently been actively researched all over the world, is largely divided into three categories.

First, a white light emitting device can be manufactured by mounting red, blue and green light emitting diode chips in one package, and controlling the respective chips. Second, a white light emitting device can be manufactured by coating a phosphor having red, blue and green luminescent properties on a UV light emitting diode chip. Third, a white light emitting device can be manufactured by coating a phosphor having a yellow luminescent property on a blue light emitting diode chip.

Among such conventional technologies, a white light emitting device using the respective red, blue and green light emitting diode chips has a problem that its operating voltage is non-uniform, and each chip's output varies according to an ambient temperature. This changes a color coordinate, and thus makes it difficult to uniformly mix respective colors with each other. Thus, in such a white light emitting device, it is difficult to obtain a pure white light. Also, in consideration of the electrical properties of respective chips or respective light emitting diodes, additional operating circuits are required. Further, such circuits are required to be controlled. Thus, the technology has a disadvantage in that the manufacturing process is complicated, and also it is inefficient to express a high-brightness white light in view of power consumption.

In order to complement the above described problems, manufacturers currently coat a phosphor, in which phosphors having red, blue and green luminescent properties are mixed in a predetermined ratio, on a UV light emitting diode chip, or coat a phosphor having a yellow luminescent property on a blue light emitting diode chip in manufacturing of a white light emitting device. This method requires a simple process and has an economical advantage, unlike the above mentioned method using the respective red, blue and green light emitting diode chips. Furthermore, in this method, an additive color mixture can be achieved by using light emitted from a phosphor. Thus, there is an advantage in that it is easy to adjust a color coordinate, and various colors can be expressed.

Especially, there are a lot of patent applications on a method which uses europium as an activator on a blue light emitting diode chip, and a silicate-based phosphor containing an alkaline earth metal. For example, Korean Patent Laid-Open Publication Nos. 2003-0067609, 2006-0015036, and 2002-0025696 disclose a method of expressing a white color by using a gallium nitride (GaN) LED chip emitting a blue light, and a YAG:Ce$^{3+}$ (Yttrium Aluminum Garnet) phosphor emitting a yellow light, mainly in a band of 460 nm. Also, Korea Patent Application Publication No. 2006-0111116A discloses a phosphor having Formula of $(Sr_{1-x-y}A_x)_2SiO_z:Eu_y$ (A represents at least one kind of alkaline earth metal selected from the group consisting of Mg, Ca, Sr, Br and Ra, $0 \leq x < 1$, $0.001 \leq y \leq 0.3$, and Z represents an integer of 1 to 5). Such a phosphor emits yellow light with an absorption peak in a range of about 300 nm to 480 nm, and an emission peak in a range of about 500 nm to 680 nm especially when $0 \leq x \leq 0.35$. In such methods for expressing white light by coating a phosphor on a light emitting diode chip with a short wavelength range, an excitation wavelength of the phosphor has to exactly correspond to a light source wavelength. If they do not correspond to each other, the phosphor has low excitation efficiency, and thus has a very low brightness. This causes a serious deviation in a color coordinate. Also, a green light emitting silicate-based phosphor may be used to realize a light emitting device, in which generally, a Eu$^{2+}$ ion is used as an activator, and a green phosphor having a Formula of $A_2SiO_4:Eu^{2+}$ is used (in Formula, "A" represents a compound of two kinds or more selected from the group consisting of "Sr", "Ba", "Ca", "Mg", etc., and another ion than Eu$^{2+}$ may be co-doped). However, a conventional green light emitting phosphor has a problem that its brightness is reduced due to irregular morphology such as the generation of a large amount of residue during a heat treatment process, and the synthesis of fluorescent particles having irregular sizes. Furthermore, there is a problem that the brightness is reduced according to the kind of a conventionally used compound in a case where the ion is doped in a heat treatment environment.

The above information disclosed in this Background section is only for enhancement of understanding of the background of the invention and therefore it may contain information that does not form the prior art that is already known in this country to a person of ordinary skill in the art.

SUMMARY OF THE DISCLOSURE

The inventors of the present invention have carried out researches and made an effort in order to solve problems of color expression, low brightness, and reliability. As a result, they have developed a green phosphor by using europium as an activator in a (halo)silicate-based host material containing an alkaline earth metal, which avoids the problems. Then, they have completed this invention based on the development.

Accordingly, an object of the present invention is to provide a novel (halo)silicate-based phosphor with an improved luminescent brightness.

Also, another object of the present invention is to provide a method for manufacturing a novel (halo)silicate-based phosphor with an improved luminescent brightness, in which the morphology is improved in the process.

In one aspect, the present invention provides a (halo)silicate-based phosphor represented by Formula 1 below, $$(Sr_{16-x-y}M_y)Si_aO_bX_cdN_2O_3:Eu^{2+}_z$$ 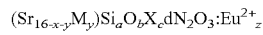   [Formula 1]

In Formula 1 above, M represents at least one kind of metal selected from the group consisting of Mg, Ca and Ba, X represents F, Cl, Br or I, N represents at least one kind of metal selected from the group consisting of Y, La, Nd, Gd, Lu, B, Al, Ga and In, $0 \leq x \leq 16$, $0 \leq y \leq 16$, $0 \leq x+y \leq 16$, $0 < z \leq 1$, $0.9 < a \leq 6$, $3 < b \leq 24$, $0 \leq c \leq 8$, and $0 \leq d \leq 2$.

The inventors have made intensive researches on improvement of a brightness of a conventional silicate phosphor, and then found that the phosphor showed an improved brightness when the (halo)silicate phosphor is added with a trivalent element(s) in a specific amount, or when the (halo)silicate phosphor is added with a halogen element(s) in a specific amount.

In another aspect, the present invention provides a method for manufacturing a (halo)silicate-based phosphor, the method including: a first step of weighing a host material including a precursor of at least one kind of alkaline earth metal selected from the group consisting of strontium (Sr), calcium (Ca) and barium (Ba), a precursor of silicon (Si), and ammonium halide, and an activator including a precursor of europium (Eu), according to a composition ratio of the phosphor represented by Formula 1 above, and mixing said weighed materials in a solvent; a second step of drying a mixture obtained from the first step in an oven at 100 to 150° C.; and a third step of performing heat treatment on the mixture dried in the second step under a condition of a mixed gas atmosphere of nitrogen and hydrogen (in volumetric ratio of 75∞95:25∞5) and a temperature of 1000 to 1350.

The inventive (halo)silicate-based phosphor can show a change of the emission wavelength according to the kind and the content of an alkaline earth metal. Also, it can show a change of the emission wavelength and an increase of the brightness according to the selective use of co-activators. Thus, it is possible to employ the phosphor in various light emitting devices such as a light emitting diode, a laser diode, a surface emitting laser diode, an inorganic electro-luminescence device, and an organic electro-luminescence device. In other words, the inventive phosphor is very useful from an industrial view point.

Other aspects and exemplary embodiments of the invention are discussed infra.

The above and other features of the invention are discussed infra.

BRIEF DESCRIPTION OF THE DRAWINGS

The above and other features of the present invention will now be described in detail with reference to certain exemplary embodiments thereof illustrated in the accompanying drawings which are given hereinbelow by way of illustration only, and thus are not limitative of the present invention, and wherein.

Figures 1, 1A:
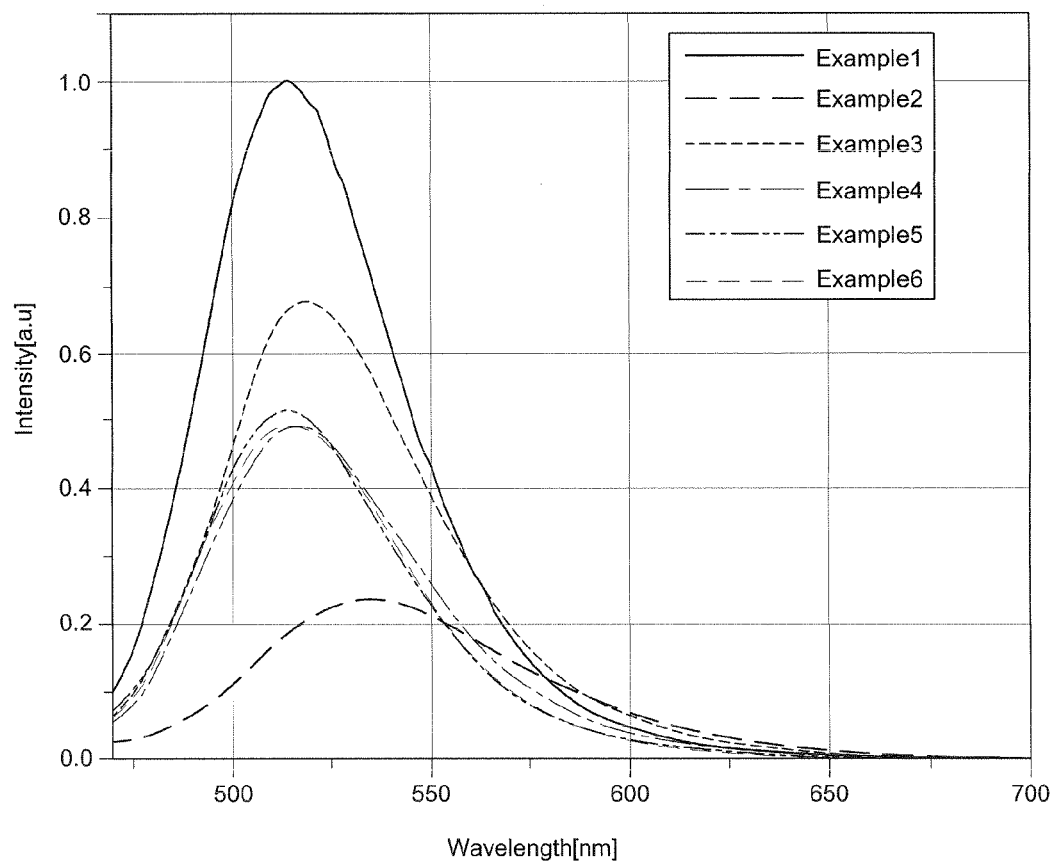
FIGS. 1a and 1b show graphs on emission spectra of phosphors according to Examples 1 to 13 of the present invention.
Figure 1B:
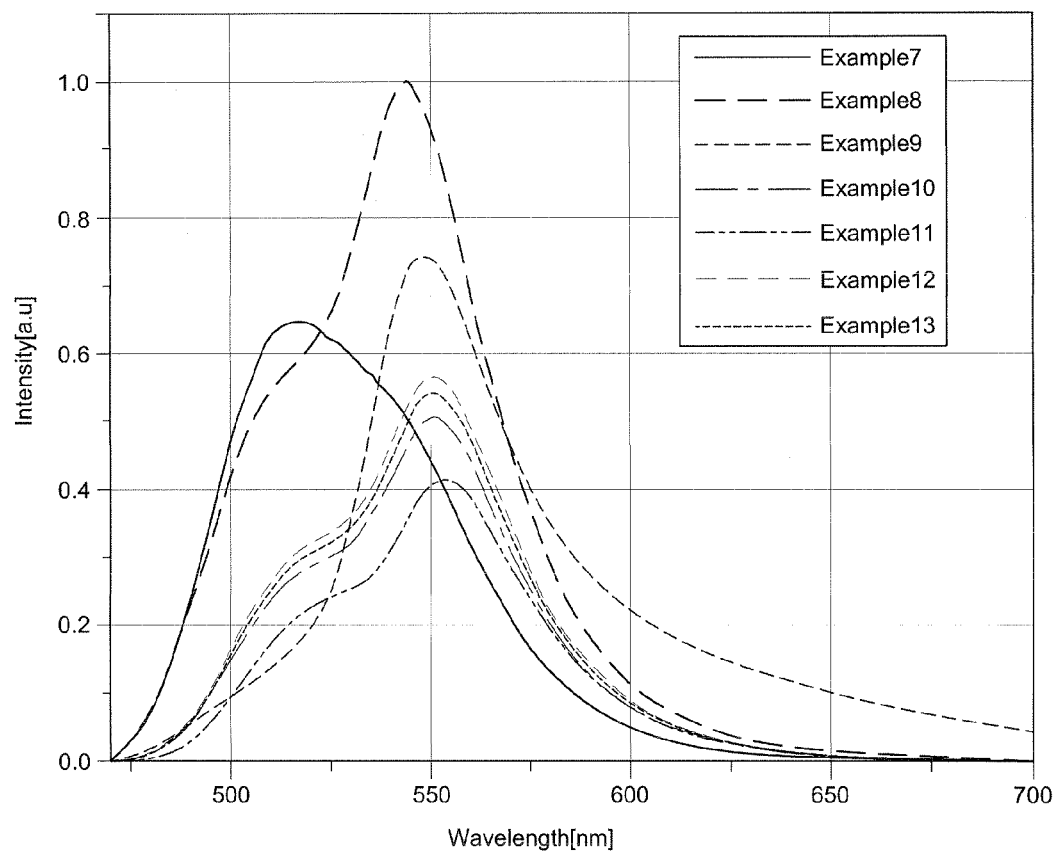
Figure 2:
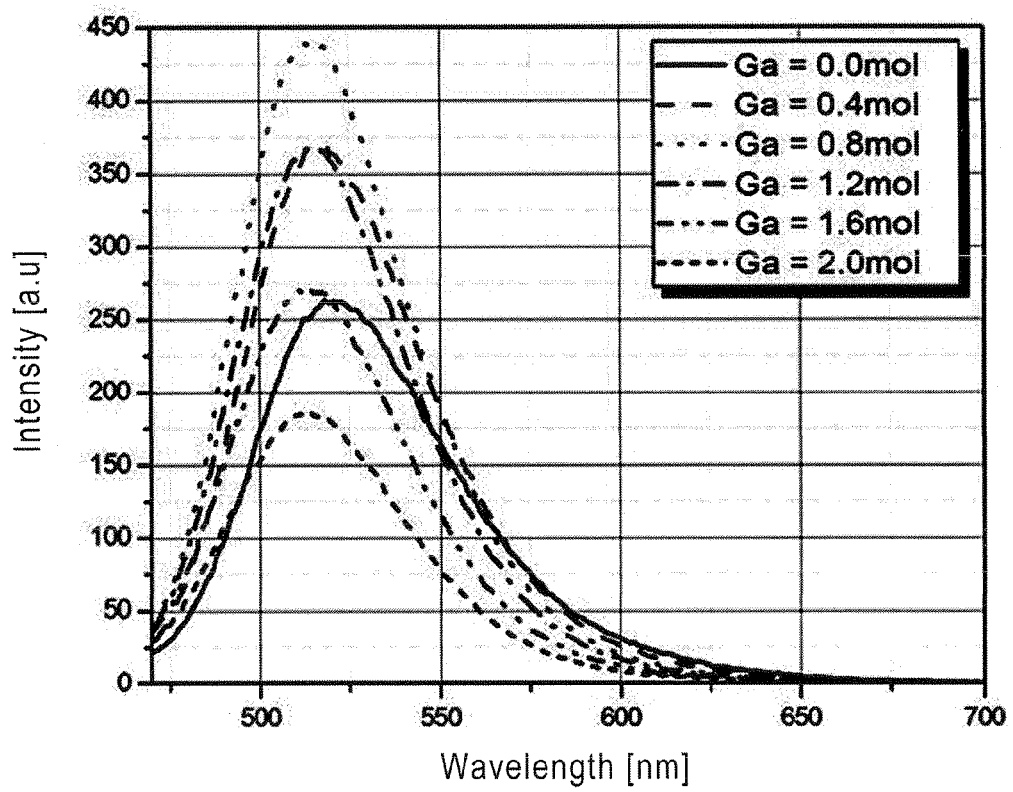
FIG. 2 shows graphs of emission spectra, which illustrate improvement of a brightness of a phosphor by addition of gallium (Ga) in an excessive amount according to the present invention.
Figure 3:
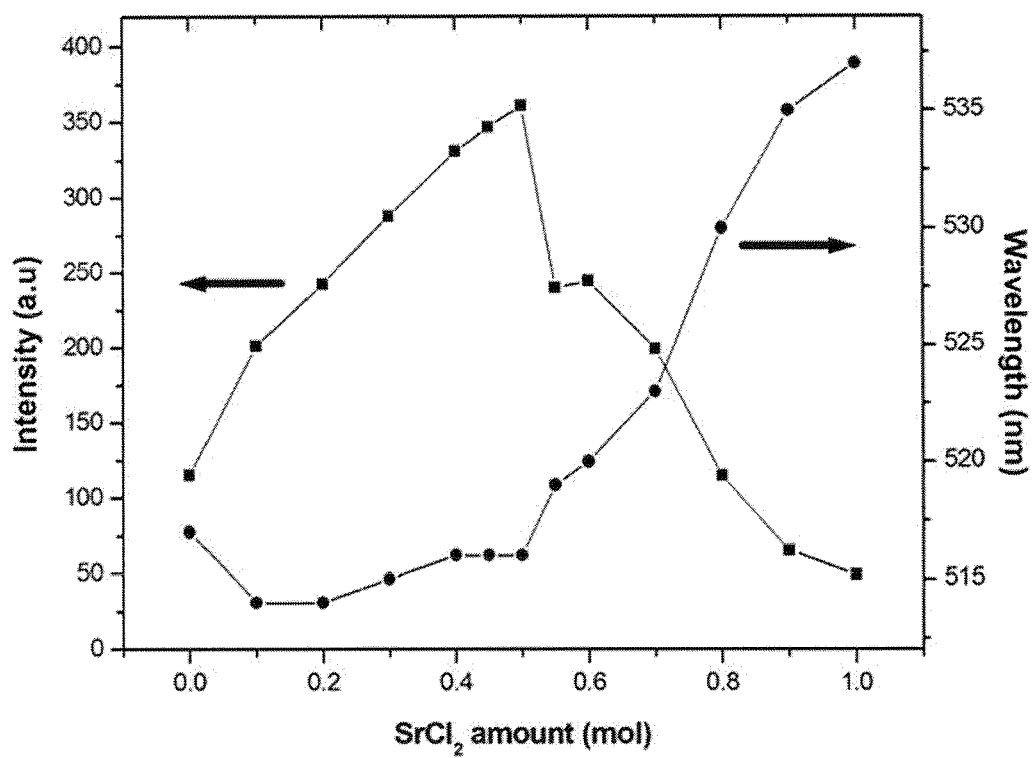
FIG. 3 shows graphs of emission spectra, which illustrate a change of a wavelength and a brightness of a phosphor by addition of chloride ($SrCl_2$) according to the present invention.
Figure 4:
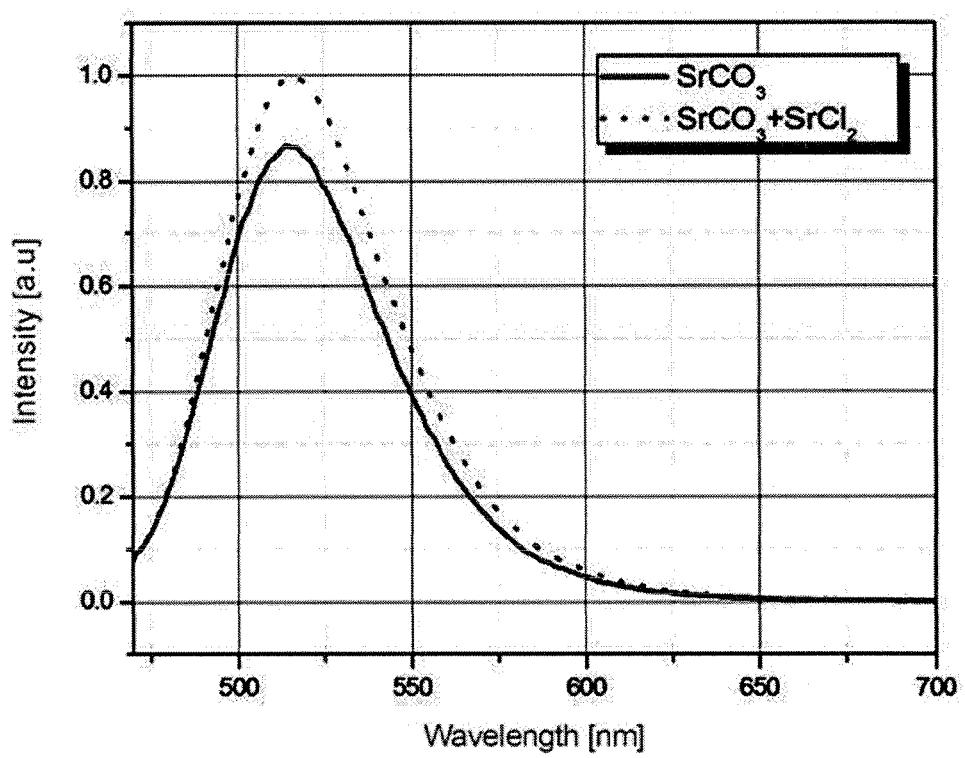
FIG. 4 shows graphs of emission spectra, which illustrate improvement of a brightness of a phosphor by addition of chloride ($SrCl_2$) according to the present invention.
Figure 5:
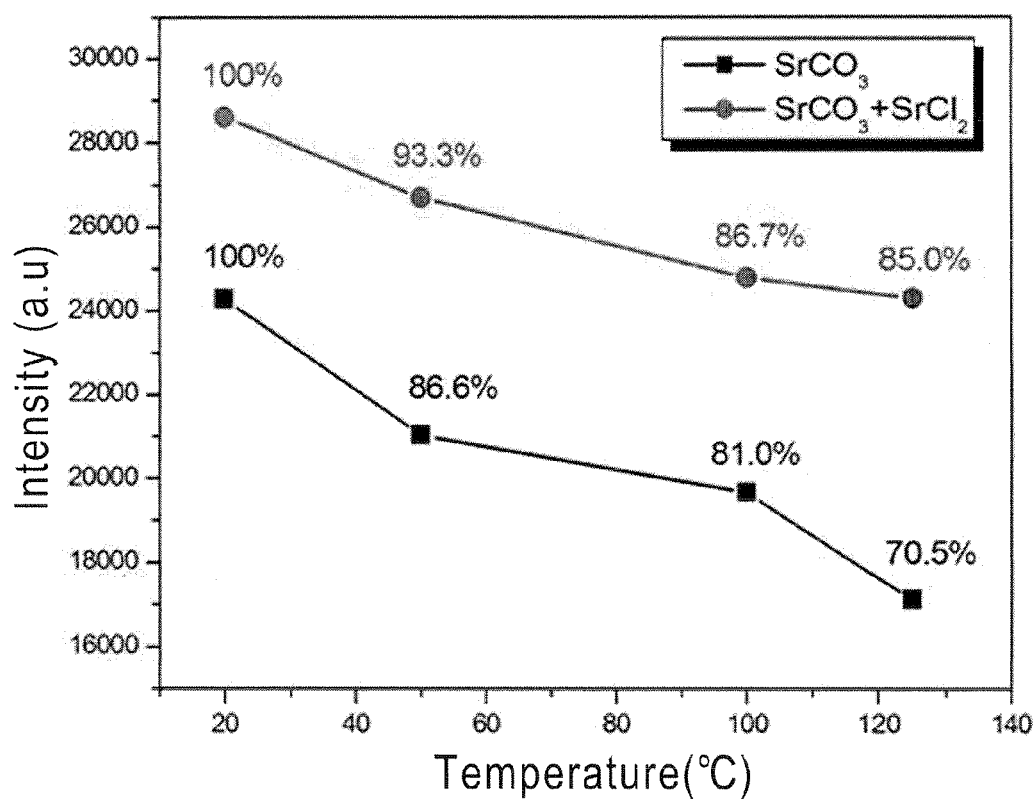
FIG. 5 shows graphs illustrating improvement of a thermal characteristic of a phosphor by addition of chloride ($SrCl_2$) according to the present invention.
Figure 6:
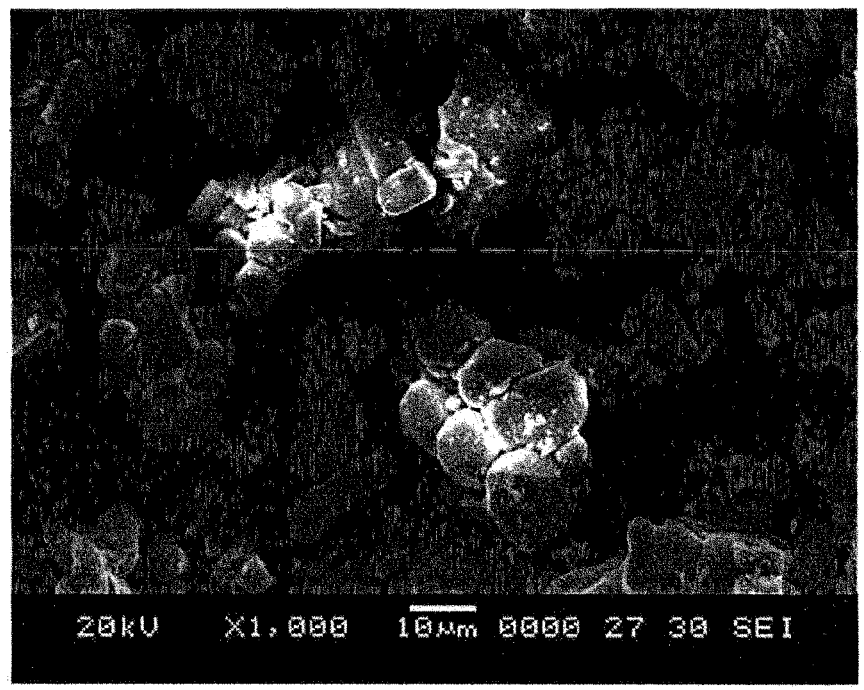
FIGS. 6a and 6b show scanning electron microscopic photographs of phosphor $(SrBa)SiO_4Ga_2O_3: Eu_{0.015}$ as prepared by Example 1 of the present invention.
Figure 6:
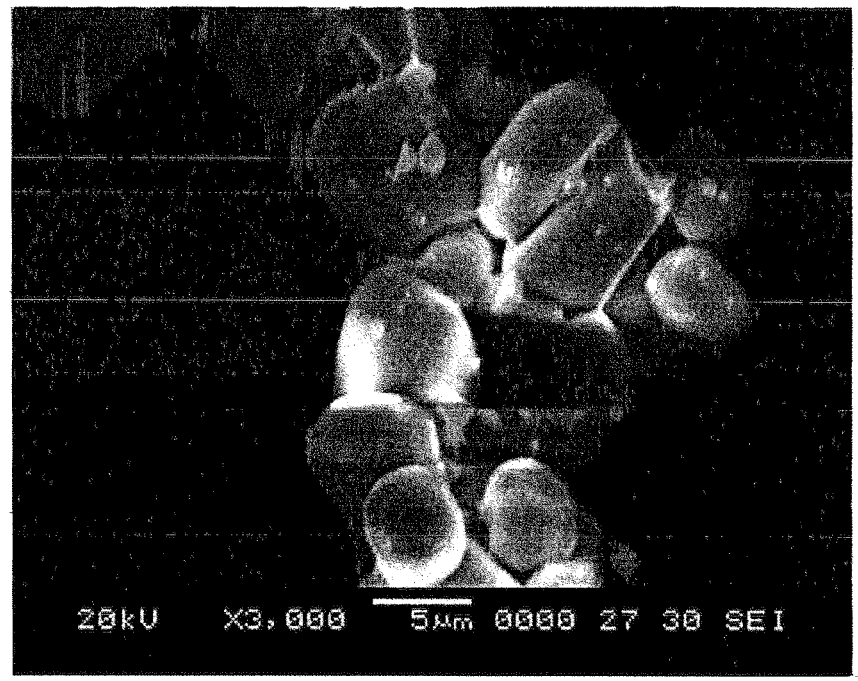

Reference numerals set forth in the Drawings include reference to the following elements as further discussed below:

| | |
|---|---|
| 1: UV light emitting chip | 2: silver (Ag) paste |
| 3: three primary colors fluorescent material | 4: gold (Au) wire |
| 5: epoxy | 6: lead frame |

It should be understood that the appended drawings are not necessarily to scale, presenting a somewhat simplified representation of various preferred features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Hereinafter reference will now be made in detail to various embodiments of the present invention, examples of which are illustrated in the accompanying drawings and described below. While the invention will be described in conjunction with exemplary embodiments, it will be understood that the present description is not intended to limit the invention to those exemplary embodiments. On the contrary, the invention is intended to cover not only the exemplary embodiments, but also various alternatives, modifications, equivalents and other embodiments, which may be included within the spirit and scope of the invention as defined by the appended claims.

The present invention relates to a (halo)silicate-based phosphor represented by Formula 1 below, in which as a host material, (halo)silicate containing at least one kind of alkaline earth metal selected from the group consisting of strontium (Sr), calcium (Ca) and barium (Ba) is used, and as an activator, europium (Eu) is used;

$$(Sr_{16-x-y}M_y)Si_aO_bX_cdN_2O_3:Eu^{2+}{}_z \qquad \text{[Formula 1]}$$

In Formula 1 above, M represents at least one kind of metal selected from the group consisting of Mg, Ca and Ba, X represents F, Cl, Br or I, N represents at least one kind of metal selected from the group consisting of Y, La, Nd, Gd, Lu, B, Al, Ga and In, $0 \leq x \leq 14$, $0 \leq y \leq 16$, $0 \leq x+y \leq 16$, $0 < z \leq 1$, $0.9 < a \leq 6$, $3 < b \leq 24$, $0 \leq c \leq 8$, and $0 \leq d \leq 2$.

The inventive (halo)silicate-based phosphor includes (halo)silicate containing at least one kind of alkaline earth metal selected from the group consisting of strontium (Sr), calcium (Ca) and barium (Ba), as a host material.

The (halo)silicate-based phosphor uses europium (Eu) as an activator, and may further use co-activators including at least one kind of metals selected from the group consisting of yttrium (Y), cerium (Ce), lanthanum (La), manganese (Mn) and samarium (Sm), together with europium (Eu).

Also, the present invention relates to a method of manufacturing a phosphor represented by Formula 1 above by firing a mixture of a metallic compound, in which M represents at least one kind of metal selected from the group consisting of bivalent elements such as Mg, Ca and Ba, N represents at least one kind of metal selected from the group consisting of trivalent elements such as Y, La, Nd, Gd, Lu, B, Al, Ga and In, X represents F, Cl, Br or I, $0 \leq x \leq 14$, $0 \leq y \leq 16$, $0 \leq x+y \leq 16$, $0 < z \leq 1$, $0.9 < a \leq 6$, $3 < b \leq 24$, $0 \leq c \leq 8$, and $0 \leq d \leq 2$, and the mixture of the metallic compound contains $SrCl_2$ or $SrF_2$.

Also, the present invention relates to a method of manufacturing a phosphor represented by Formula 1 above by firing a mixture of a metallic compound, in which M represents at least one kind of metal selected from the group consisting of bivalent elements such as Mg, Ca and Ba, N represents at least one kind of metal selected from the group consisting of trivalent elements such as Y, La, Nd, Gd, Lu, B, Al, Ga and In, X represents F, Cl, Br or I, $0 \leq x \leq 14$, $0 \leq y \leq 16$, $0 \leq x+y \leq 16$, $0 < z \leq 1$, $0.9 < a \leq 6$, $3 < b \leq 24$, $0 \leq c \leq 8$, and $0 \leq d \leq 2$, and the mixture of the metallic compound contains $CaCl_2$ or $CaF_2$.

Also, the present invention relates to a method of manufacturing a phosphor represented by Formula 1 above by firing a mixture of a metallic compound, in which M represents at least one kind of metal selected from the group consisting of bivalent elements such as Mg, Ca and Ba, N represents at least one kind of metal selected from the group consisting of trivalent elements such as Y, La, Nd, Gd, Lu, B, Al, Ga and In, X represents F, Cl, Br or I, $0 \leq x \leq 14$, $0 \leq y \leq 16$, $0 \leq x+y 16$, $0 < z \leq 1$, $0.9 < a \leq 6$, $3 < b \leq 24$, $0 \leq c \leq 8$, and $0 \leq d \leq 2$, and the mixture of the metallic compound contains $BaCl_2$ or $BaF_2$.

Also, the present invention relates to a method of manufacturing a phosphor represented by Formula 1 above by firing a mixture of a metallic compound, in which M represents at least one kind of metal selected from the group consisting of bivalent elements such as Mg, Ca and Ba, N represents at least one kind of metal selected from the group consisting of trivalent elements such as Y, La, Nd, Gd, Lu, B, Al, Ga and In, X represents F, Cl, Br or I, $0 \leq x \leq 14$, $0 \leq y \leq 16$, $0 \leq x+y \leq 16$, $0 < z \leq 1$, $0.9 < a \leq 6$, $3 < b \leq 24$, $0 \leq c \leq 8$, and $0d \leq 2$, and the mixture of the metallic compound contains $EuCl_3$ or $EuF_3$.

The inventive (halo)silicate-based phosphor has an emission wavelength of 510 to 555 nm at an excitation wavelength of 350 to 500 nm, and shows characteristics such as a change of the emission wavelength and an increase of brightness according to the kind and the content of an alkaline earth metal. Also, it shows characteristics such as a change of the emission wavelength and an increase of the brightness according to the selective use of co-activators.

A method of manufacturing the inventive (halo)silicate-based phosphor is not particularly limited as long as it is generally used in the art. For example, the method may include a first step: weighing a host material including precursors of strontium (Sr), barium (Ba), gallium (Ga) and silicon (Si), and ammonium halide, and an activator including a precursor of europium (Eu), according to a composition ratio of the phosphor represented by Formula 1 above, and mixing said weighed materials in a solvent; a second step of drying a mixture obtained from the first step in an oven at 100 to 150° C.; and a third step of performing heat treatment on the mixture dried in the second step under a condition of a mixed gas atmosphere of nitrogen and hydrogen (in volumetric ratio of 75~95:25~5) and a temperature of 1000 to 1350° C.

The (halo)silicate-based phosphor may further use precursors of at least one kind of metals selected from the group consisting of yttrium (Y), cerium (Ce), lanthanum (La), manganese (Mn) and samarium (Sm), as co-activators, together with europium (Eu). The precursor of europium (Eu), yttrium (Y), cerium (Ce), lanthanum (La), manganese (Mn) and samarium (Sm) each may be one kind or a mixture of two kinds or more selected from the group consisting of oxide, chloride, hydroxide, carbonate and superoxide of each metal.

In the first step of the method of manufacturing the (halo) silicate-based phosphor, the precursor of strontium (Sr), M (M represents at least one kind of metal selected from the group consisting of bivalent elements such as Mg, Ca and Ba), N (N represents at least one kind of metal selected from the group consisting of trivalent elements such as Y, La, Nd, Gd, Lu, B, Al, Ga and In), silicon (Si), and europium (Eu) each may be one kind or a mixture of two kinds or more selected from the group consisting of oxide, chloride, hydroxide, nitrate, carbonate and superoxide of each metal.

Especially, from among the precursors of strontium (r), strontium carbonate is excellent in a luminous intensity characteristic, and thus may be more preferably used. Meanwhile, strontium chloride is used not only as a precursor but also as a chlorine (Cl) source for a host material of a halo silicate phosphor, and thus is required to be added in an amount greater, by 2 moles, than that in a composition ratio of strontium (Sr). Also, from among the precursor of silicon (Si), silicon dioxide excellent in productivity may be more preferably used.

In a case where a halogen element is Cl, chloride such as $SrCl_2$, $BaCl_2$ or $EuCl_3$ may be used as one of compounds containing a corresponding metallic element, in such a manner that the inventive phosphor can contain the halogen element. Otherwise, in a case where such as chloride is not used as a compound containing a corresponding metallic element, ammonium chloride is used. Meanwhile, even in a case where such a chloride is used, ammonium chloride may be used. When among these materials, $SrCl_2$ is used, and the mixture of the metallic compound contains $SrCl_2$, it is possible to obtain highly crystalline oxide, and to produce a phosphor with an improved brightness. Thus, $SrCl_2$ is preferred [FIGS. 2 to 5].

In a case where a halogen element is F, fluoride such as $SrF_2$, $BaF_2$ or $EuF_3$ may be used as one of compounds containing a corresponding metallic element, in such a manner that the inventive phosphor can contain the halogen element. Otherwise, in a case where such a fluoride is not used as a compound containing a corresponding metallic element, fluorine ammonium is used. Meanwhile, even in a case where such a fluoride is used, fluorine ammonium may be used. When the inventive halogen element is Cl or F, for example, the mixture of the metallic compound may contain $SrCl_2$ or $EuF_3$.

A method of mixing the precursors is not particularly limited as long as it is generally used in the art. For example, a mixing method such as mortar milling, wet ball milling or dry ball milling may be used. Also, the solvent used in the mixing of the precursors is not particularly limited as long as it is generally used in the art. For example, distilled water, a lower grade alcohol having 1 to 4 carbon atoms, acetone or the like may be used.

In the second step of the method of manufacturing the (halo)silicate phosphor, the drying temperature for evaporating the solvent ranges from 100 to 150° C. Herein, when the drying temperature is less than 100° C., the solvent is not evaporated. On the other hand, when the temperature is greater than 150° C., the solvent itself may react with constituents of the inventive phosphor, thereby producing by-products. Thus, it is preferable to maintain the above mentioned range.

In the third step of the method of manufacturing the (halo) silicate-based phosphor, the mixed-gas of nitrogen and hydrogen is used in the heat treatment. Herein, reduction treatment is carried out in such a manner that the activator can be substituted in the (halo)silicate-based phosphor. Herein, when the volumetric ratio of hydrogen is less than 5%, the reduction of the phosphor is not completely performed. Thus, a silicate-based crystal is not completely produced. On the other hand, when the volumetric ratio of hydrogen is greater than 25%, there is a danger of explosion of the mixed-gas due to the mixed-gas' reactivity at a high temperature. Thus, it is preferable to maintain the volumetric ratio of nitrogen and hydrogen within a range of 75~95:25~5.

In the heat treatment of the (halo)silicate-based phosphor, the heat treatment temperature ranges from 1000 to 1350° C. Herein, when the heat treatment temperature is less than 1000° C., a silicate-based crystal is not completely produced. This reduces a luminescent brightness, thereby the luminous efficiency. On the other hand, when the heat treatment temperature is greater than 1350° C., the crystal of the (halo) silicate-based phosphor is separated and melted. This makes it difficult to manufacture phosphor powder, and to control the size of powder.

The phosphor obtained from the above described method may be ground through ball milling or jet milling, and grinding and firing steps may be repeated twice or more. As required, the resultant phosphor may be washed or sorted. In some cases, the content of a halogen element(s) may be controlled by the washing step. In a case where an operation of causing a change of the content of the halogen element(s) is performed after the washing step, when the changed content of the halogen element(s) in a phosphor satisfies the above described molar ratio, the phosphor is considered to be included in the inventive phosphor. The content of a halogen element(s) within the fired phosphor is reduced by the control in the washing step, and thereafter, is hardly changed and stays stable. Specifically, the washing step includes the step of bringing the fired product obtained after the firing step of the mixture of the metallic compound in to contact with acid. In this case, the resultant phosphor has a more improved brightness, and is preferable. Also, when the fired product is brought in to contact with acid, the brightness may be increased at 100° C., thereby improving a temperature characteristic of the phosphor. The method of bringing the fired product in to contact with acid includes a method of immersing the fired product in acid, a method of immersing the fired product in acid during agitation, and a method of mixing the fired product with acid through wet ball milling. Preferably, the method of immersing the fired product in acid during agitation may be used.

Specific examples of the acid may include organic acid such as acetic acid and oxalic acid, or inorganic acid such as hydrochloric acid, nitric acid and sulfuric acid. Hydrochloric acid, nitric acid or sulfuric acid is preferred, and especially, hydrochloric acid is preferred. The acid preferably has a hydrogen ion concentration ranging from about 0.001 to 2 mol/L for the sake of handling thereof. The temperature of the acid in contact with the fired product is room temperature (about 25° C.), and as required, the acid may be heated up to about 30 to about 80° C. The fired product is generally in contact with the acid for 1 second to about 10 hours.

The present invention provides a light emitting device that includes a (halo)silicate-based phosphor represented by Formula 1 above, and a semiconductor light emitting diode chip, and is excited by light emitted from the light emitting diode chip. More specifically, the inventive (halo)silicate-based phosphor may be usefully applied to a light emitting device requiring a good color rendition, a high durability, and a high brightness, such as a light emitting diode, a laser diode, a surface emitting laser diode, an inorganic electro-luminescence device, or an organic electro-luminescence device.

The inventive (halo)silicate-based phosphor may be used alone, and may be used in combination with other phosphors. Also, the inventive (halo)silicate-based phosphor may preferably have a size ranging from 5 to 20 μm so that it can be used in the light emitting device. Herein, when the size of the phosphor is less than 5 μm, the brightness may be lowered, and on the other hand, when the size is greater than 20 μm, it is difficult to apply the phosphor to the light emitting device. Thus, it is preferable to maintain the above mentioned range.

As an example of the light emitting device, a light emitting diode includes a light source for emitting light, a substrate for supporting the light source, and a molding member molded around the light source. Accordingly, a coating phosphor composition for the light emitting device, which includes the inventive (halo)silicate-based phosphor, and a transparent resin as the molding member, may be molded around the light emitting diode chip so as to obtain the light emitting diode. Herein, a coating phosphor composition for the light emitting device may include the inventive (halo)silicate-based phosphor and the transparent resin in a predetermined content ratio according to the application field of the light emitting device. The transparent resin is not particularly limited as long as it is generally used in the art. For example, an epoxy resin, a silicon resin, a polyimide resin, an urea resin, an acrylic resin or the like may be used. The molding member necessarily includes at least one kind of the inventive phosphor irrespective of a single structure or a multi-structure.

Although the technical characteristics of the inventive light emitting device have been illustrated by specific embodiments, it is obvious to those skilled in the art that additions, modifications, and deletions in the configuration of the inventive light emitting diode may be made within the scope of the spirit of the present invention.

EXAMPLES

The following examples illustrate the invention and are not intended limit the same.

Examples 1 to 13

Precursors of respective metals were mixed in a composition As shown in Table 1 below. The mixture was added in 50 ml of ethanol and mixed for 1 hour through ball milling. The mixture was dried in a 100° C. dryer for 6 hours so as to completely evaporate the ethanol. The mixture remaining after the solvent had been completely dried was charged in an alumina crucible, and subjected to heat treatment at 1150° C. for 3 hours. Herein, a mixed-gas including hydrogen of 50 cc/min and nitrogen of 150 cc/min was supplied thereto so that the heat treatment could be carried out under a reduction atmosphere. Then, the resultant phosphor was ground in such a manner that its particle site could be 20 μm or less. On the phosphor as produced above, the optical property was tested by using an emission spectrum with an excitation wavelength of 450 nm. The results are noted in Table 2 below.

TABLE 1

| Index | Formula | Precursor (mass, g) | | | | | | |
|---|---|---|---|---|---|---|---|---|
| | | Sr | Ca, Ba, Mg | Ga, Al, In | Si | X | Eu | co-activator |
| Example 1 | $(SrBa)SiO_4Ga_2O_3{:}Eu_{0.015}$ | $SrCO_3$ (0.30) | $BaCO_3$ (0.72) | $Ga_2O_3$ (0.29) | $SiO_2$ (0.23) | $SrCl_2 6H_2O$ (0.46) $NH_4Cl$ (0.01) | $Eu_2O_3$ (0.01) | — |
| Example 2 | $(SrBa)Al_2SiO_7{:}Eu_{0.015}$ | $SrCO_3$ (0.29) | $BaCO_3$ (0.66) | $Al_2O_3$ (0.38) | $SiO_2$ (0.22) | $SrCl_2 6H_2O$ (0.44) $NH_4Cl$ (0.01) | $Eu_2O_3$ (0.01) | — |
| Example 3 | $(SrBa)In_2SiO_7{:}Eu_{0.015}$ | $SrCO_3$ (0.22) | $BaCO_3$ (0.5) | $In_2O_3$ (0.77) | $SiO_2$ (0.17) | $SrCl_2 6H_2O$ (0.33) $NH_4Cl$ (0.01) | $Eu_2O_3$ (0.008) | — |
| Example 4 | $(SrBa)AlGaSiO_7{:}Eu_{0.015}$ | $SrCO_3$ (0.27) | $BaCO_3$ (0.61) | $Ga_2O_3$ (0.32) $Al_2O_3$ (0.18) | $SiO_2$ (0.21) | $SrCl_2 6H_2O$ (0.41) $NH_4Cl$ (0.01) | $Eu_2O_3$ (0.009) | — |
| Example 5 | $(SrBa)InGaSiO_7{:}Eu_{0.015}$ | $SrCO_3$ (0.24) | $BaCO_3$ (0.53) | $Ga_2O_3$ (0.28) $In_2O_3$ (0.41) | $SiO_2$ (0.18) | $SrCl_2 6H_2O$ (0.36) $NH_4Cl$ (0.01) | $Eu_2O_3$ (0.008) | — |
| Example 6 | $(Sr_2Ba)Si_2O_7Ga_2O_3{:}Eu_{0.03}$ | $SrCO_3$ (0.53) | $BaCO_3$ (0.52) | $Ga_2O_3$ (0.2) | $SiO_2$ (0.31) | $SrCl_2 6H_2O$ (0.42) $NH_4Cl$ (0.01) | $Eu_2O_3$ (0.014) | — |
| Example 7 | $(Sr_5)Si_2O_7Cl_4Ga_2O_3{:}Eu_{0.3}$ | $SrCO_3$ (0.96) | — | $Ga_2O_3$ (0.12) | $SiO_2$ (0.2) | $SrCl_2 6H_2O$ (0.60) $NH_4Cl$ (0.05) | $Eu_2O_3$ (0.08) | — |
| Example 8 | $(Sr_4Ba_1)Si_2O_7Cl_4Ga_2O_3{:}Eu_{0.3}$ | $SrCO_3$ (0.77) | $BaCO_3$ (0.32) | $Ga_2O_3$ (0.12) | $SiO_2$ (0.2) | $SrCl_2 6H_2O$ (0.60) $NH_4Cl$ (0.059) | $Eu_2O_3$ (0.08) | — |
| Example 9 | $(Sr_4Ba_1)Si_2O_7Cl_4Ga_2O_3{:}Eu_{0.3}, Mn_{0.1}$ | $SrCO_3$ (0.77) | $BaCO_3$ (0.32) | $Ga_2O_3$ (0.12) | $SiO_2$ (0.2) | $SrCl_2 6H_2O$ (0.60) $NH_4Cl$ (0.059) | $Eu_2O_3$ (0.08) | MnO (0.006) |
| Example 10 | $(Sr_3Ca_1Ba_1)Si_2O_7Cl_4Ga_2O_3{:}Eu_{0.3}$ | $SrCO_3$ (0.57) | CaO (0.09) $BaCO_3$ (0.32) | $Ga_2O_3$ (0.12) | $SiO_2$ (0.2) | $SrCl_2 6H_2O$ (0.60) $NH_4Cl$ (0.059) | $Eu_2O_3$ (0.08) | — |
| Example 11 | $(Sr_3Ca_1Ba_1)Si_2O_7F_4Ga_2O_3{:}Eu_{0.3}$ | $SrCO_3$ (0.57) | CaO (0.09) $BaCO_3$ (0.32) | $Ga_2O_3$ (0.12) | $SiO_2$ (0.2) | $CaF_2$ (0.26) $NH_4Cl$ (0.059) | $Eu_2O_3$ (0.08) | — |
| Example 12 | $(Sr_3Ca_1Ba_1)Si_2O_7Cl_4Ga_2O_3{:}Eu_{0.3}, Ce_{0.05}$ | $SrCO_3$ (0.57) | CaO (0.09) $BaCO_3$ (0.32) | $Ga_2O_3$ (0.12) | $SiO_2$ (0.2) | $SrCl_2 6H_2O$ (0.60) $NH_4Cl$ (0.059) | $Eu_2O_3$ (0.08) | $CeO_2$ (0.013) |
| Example 13 | $(Sr_3Ca_1Ba_1)Si_2O_7Cl_4Ga_2O_3{:}Eu_{0.3}, Y_{0.05}$ | $SrCO_3$ (0.57) | CaO (0.09) $BaCO_3$ (0.32) | $Ga_2O_3$ (0.12) | $SiO_2$ (0.2) | $SrCl_2 6H_2O$ (0.60) $NH_4Cl$ (0.059) | $Eu_2O_3$ (0.08) | $Y_2O_3$ (0.009) |
| Example 14 | $Ca_8MgSi_4O_{16}Cl_2Ga_2O_3{:}Eu_{0.2}$ | — | $CaCO_3$ (0.82) MgO (0.07) | $Ga_2O_3$ (0.13) | $SiO_2$ (0.41) | $CaCl_2 2H_2O$ (0.50) $NH_4Cl$ (0.059) | $Eu_2O_3$ (0.06) | — |
| Example 15 | $(Sr_9Ba)Si_6O_{21}Cl_2Ga_2O_3{:}Eu_{0.2}$ | $SrCO_3$ (0.87) | $BaCO_3$ (0.17) | $Ga_2O_3$ (0.07) | $SiO_2$ (0.34) | $SrCl_2 6H_2O$ (0.50) $NH_4Cl$ (0.059) | $Eu_2O_3$ (0.03) | — |
| Example 16 | $(Ca_{14}Mg_2)Si_6O_{24}Cl_8Ga_2O_3{:}Eu_{0.2}$ | — | $CaCO_3$ (0.81) MgO (0.08) | $Ga_2O_3$ (0.07) | $SiO_2$ (0.33) | $CaCl_2 2H_2O$ (0.68) $NH_4Cl$ (0.059) | $Eu_2O_3$ (0.03) | — |

Example 1: x = 14, y = 1, z = 0.015, a = 1, b = 4, c = 0, d = 1.
Example 2: x = 14, y = 1, z = 0.015, a = 1, b = 7, c = 0, d = 2.
Example 3: x = 14, y = 1, z = 0.015, a = 1, b = 7, c = 0, d = 2.
Example 4: x = 14, y = 1, z = 0.015, a = 1, b = 7, c = 0, d = 2.
Example 5: x = 14, y = 1, z = 0.015, a = 1, b = 7, c = 0, d = 2.
Example 6: x = 13, y = 1, z = 0.03, a = 2, b = 7, c = 0, d = 1.
Example 7: x = 11, y = 0, z = 0.3, a = 2, b = 7, c = 4, d = 1.
Example 8: x = 11, y = 1, z = 0.3, a = 2, b = 7, c = 4, d = 1.
Example 9: x = 11, y = 1, z = 0.4, a = 2, b = 7, c = 4, d = 1.

TABLE 1-continued

| | | Precursor (mass, g) | | | | | |
|---|---|---|---|---|---|---|---|
| Index | Formula | Sr | Ca, Ba, Mg | Ga, Al, In | Si | X | Eu | co-activator |

Example 10: x = 11, y = 2, z = 0.3, a = 2, b = 7, c = 4, d = 1.
Example 11: x = 11, y = 2, z = 0.3, a = 2, b = 7, c = 4, d = 1.
Example 12: x = 11, y = 2, z = 0.35, a = 2, b = 7, c = 4, d = 1.
Example 13: x = 11, y = 2, z = 0.35, a = 2, b = 7, c = 4, d = 1.
Example 14: x = 7, y = 9, z = 0.2, a = 4, b = 16, c = 2, d = 1.
Example 15: x = 6, y = 1, z = 0.2, a = 6, b = 21, c = 2, d = 1.
Example 16: x = 0, y = 16, z = 0.2, a = 6, b = 24, c = 8, d = 1.

TEST EXAMPLES

Test Example 1

The spectrum and the brightness at an emission wavelength were measured by using a Photoluminescence machine (PSI Corporation).

TABLE 2

| Index | Formula | Light emitting wavelength (@ 450 nm excitation) | Size (μm) |
|---|---|---|---|
| Example 1 | $(SrBa)SiO_4Ga_2O_3:Eu_{0.015}$ | 516 nm | 15 μm |
| Example 2 | $(SrBa)Al_2SiO_7:Eu_{0.015}$ | 535 nm | 19 μm |
| Example 3 | $(SrBa)In_2SiO_7:Eu_{0.015}$ | 517 nm | 19 μm |
| Example 4 | $(SrBa)AlGaSiO_7:Eu_{0.015}$ | 519 nm | 15 μm |
| Example 5 | $(SrBa)InGaSiO_7:Eu_{0.015}$ | 517 nm | 15 μm |
| Example 6 | $(Sr_2Ba)Si_2O_7Ga_2O_3:Eu_{0.03}$ | 522 nm | 10 μm |
| Example 7 | $(Sr_5)Si_2O_7Cl_4Ga_2O_3:Eu_{0.3}$ | 520 nm | 15 μm |
| Example 8 | $(Sr_4Ba_1)Si_2O_7Cl_4Ga_2O_3:Eu_{0.3}$ | 545 nm | 15 μm |
| Example 9 | $(Sr_4Ba_1)Si_2O_7Cl_4Ga_2O_3:Eu_{0.3}, Mn_{0.1}$ | 555 nm | 20 μm |
| Example 10 | $(Sr_3Ca_1Ba_1)Si_2O_7Cl_4Ga_2O_3:Eu_{0.3}$ | 550 nm | 20 μm |
| Example 11 | $(Sr_3Ca_1Ba_1)Si_2O_7F_4Ga_2O_3:Eu_{0.3}$ | 552 nm | 20 μm |
| Example 12 | $(Sr_3Ca_1Ba_1)Si_2O_7Cl_4Ga_2O_3:Eu_{0.3}, Ce_{0.05}$ | 550 nm | 15 μm |
| Example 13 | $(Sr_3Ca_1Ba_1)Si_2O_7Cl_4Ga_2O_3:Eu_{0.3}, Y_{0.05}$ | 550 nm | 15 μm |
| Example 14 | $(Ca_8Mg)Si_4O_{16}Cl_2Ga_2O_3:Eu_{0.2}$ | 510 nm | 20 μm |
| Example 15 | $(Sr_9Ba)Si_6O_{21}Cl_2Ga_2O_3:Eu_{0.2}$ | 545 nm | 15 μm |
| Example 16 | $(Ca_{14}Mg_2)Si_6O_{24}Cl_8Ga_2O_3:Eu_{0.2}$ | 515 nm | 15 μm |

As shown in Table 2 above, it was found that the inventive (halo)silicate-based phosphor emits light in a wavelength range of 510~555 nm by an excitation wavelength of 450 nm. This phosphor has a different structure from that of a conventional phosphor, and can be variously utilized as a phosphor capable of expressing various colors.

Also, the inventive (halo)silicate-based phosphor may show a change in the emission wavelength according to the kind and content of an alkaline earth metal, and may have effects such as a change of the emission wavelength and an increase of the brightness according to the selective use of co-activators. Accordingly, it is expected that when the phosphor is applied to various kinds of light emitting devices according to the present invention, it is possible to achieve low power consumption.

Test Example 2

Manufacturing of a Green Light Emitting Diode

Figure 7:
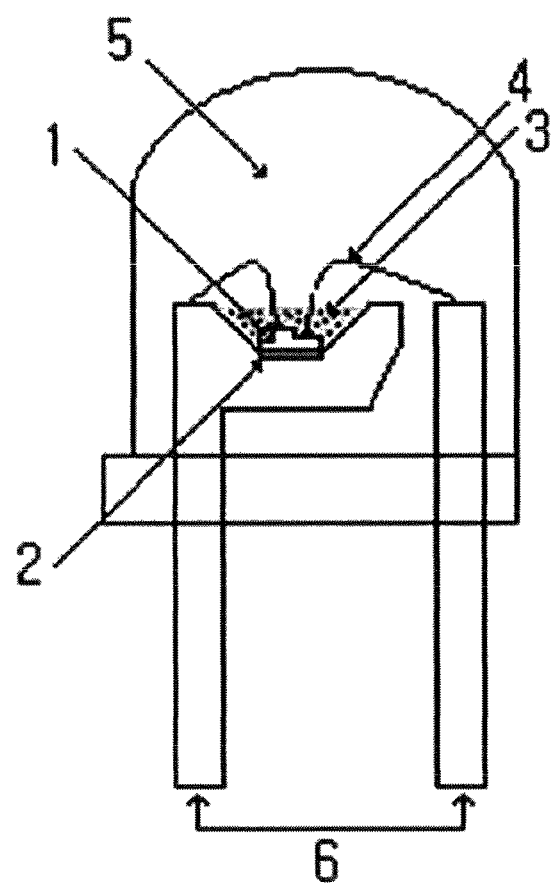
FIG. 7 shows a view of a package type of a white light emitting diode.
Figure 8:
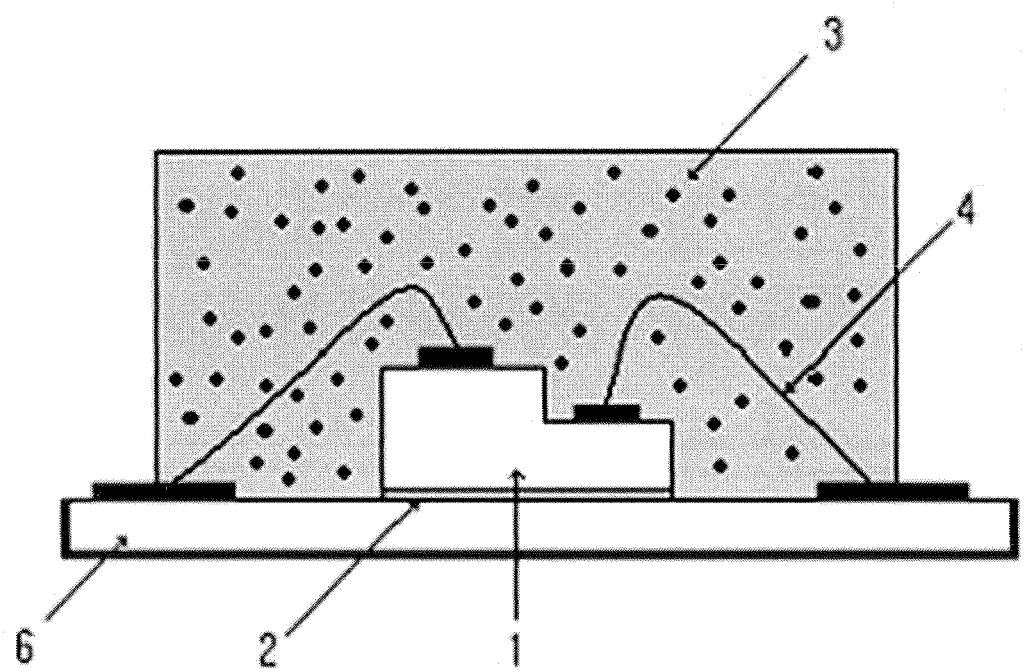
FIG. 8 shows a view of a top light emitting diode.
Figure 9:
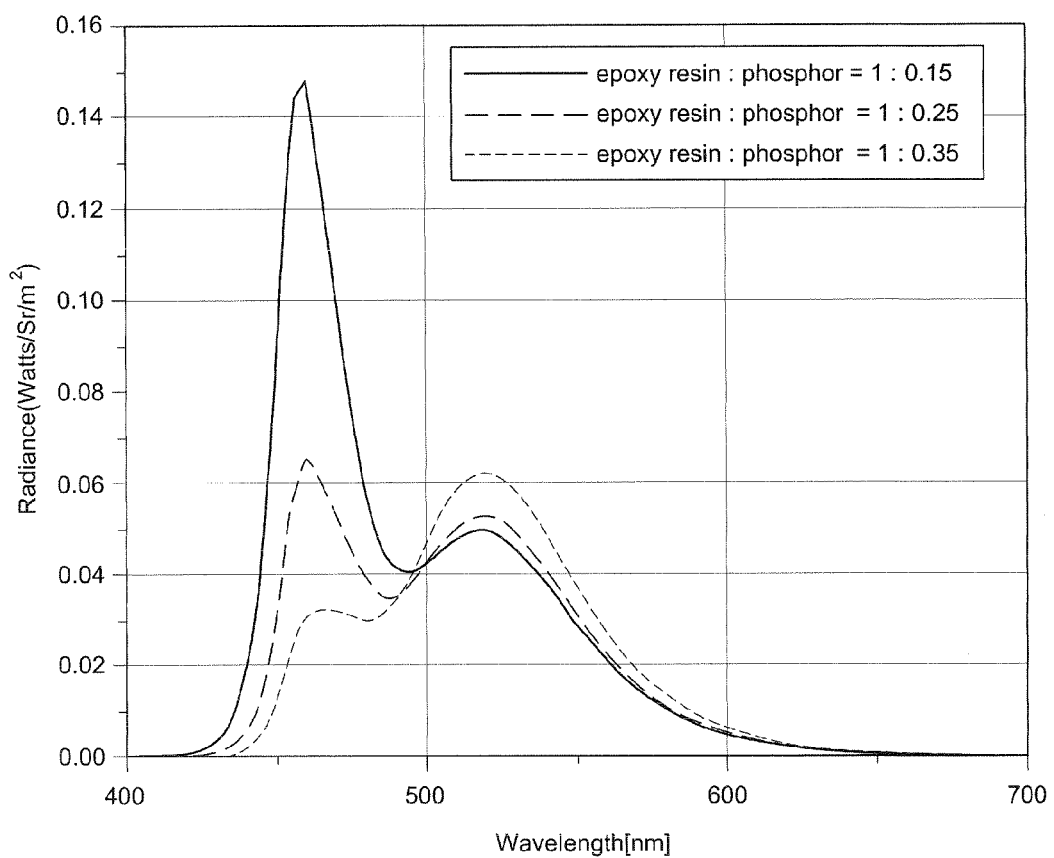
FIG. 9 shows graphs of emission spectra of a white light emitting diode when a weight ratio of an epoxy resin and the phosphor varies (1:0.15, 1:0.25, and 1:0.35), in which the white light emitting diode includes a phosphor $((SrBa)SiO_4Ga_2O_3:Eu_{0.015})$ as prepared by Example 1 of the present invention and uses a chip emitting light at 450 nm.

FIGS. 7 and 8 show a package type of green light emitting diode, and a top green light emitting diode, respectively. Such a green light emitting diode has an electrode, and an LED chip adhesively fixed by silver (Ag) paste, in which the LED chip is electrically connected to the electrode by gold (Au) wire. The LED chip is received within a hole cup, and the hole cup includes a mixture obtained by mixing an epoxy resin as a transparent resin, and the (halo)silicate-based phosphor according to Example 1 in weight ratios of 1:0.15, 1:0.25, and 1:0.35. The mixture of the phosphor is injected into the hole cup, and is cured at 140° C. Through this process, a final product was manufactured. Herein, in FIG. 7, a mixture curing portion is formed within a reflector. Herein, a green emission spectrum is shown in FIG. 9.

The invention has been described in detail with reference to exemplary embodiments thereof. However, it will be appreciated by those skilled in the art that changes may be made in these embodiments without departing from the principles and spirit of the invention, the scope of which is defined in the appended claims and their equivalents.

What is claimed is:

1. A (halo)silicate-based phosphor represented by Formula 1 below;

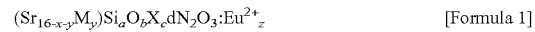

$(Sr_{16-x-y}M_y)Si_aO_bX_cdN_2O_3:Eu^{2+}_z$ [Formula 1]

wherein in Formula 1, M represents at least one kind of metal selected from the group consisting of Mg, Ca, and Ba, X represents F, Cl, Br or I, N represents at least one kind of metal selected from the group consisting of Y, La, Nd, Gd, Lu, B, Al, Ga and In, $0 \le x \le 14$, $0 \le y \le 16$, $0 \le x+y \le 16$, $0 < z \le 1$, $0.9 < a \le 6$, $3 < b \le 24$, $0 < c \le 8$, and $0.5 < d \le 2$.

2. The (halo)silicate-based phosphor of claim 1, which further uses at least one kind of co-activators selected from the group consisting of yttrium (Y), cerium (Ce), lanthanum (La), manganese (Mn) and samarium (Sm), together with europium (Eu).

3. The (halo)silicate-based phosphor of claim 1, which has an emission wavelength of 510 to 555 nm at an excitation wavelength of 350 to 500 nm.

4. The (halo)silicate-based phosphor of claim 1, which has a size of 5 to 20 μm.

5. A method of manufacturing a (halo)silicate-based phosphor, comprising:
a first step of weighing a host material comprising a precursor of $N_2O_3$, wherein N is selected from the group consisting of Y, La, Nd, Gd, Lu, B, Al, Ga and In, a precursor of at least one kind of alkaline earth metal selected from the group consisting of strontium (Sr), calcium (Ca) and barium (Ba), a precursor of silicon (Si), and ammonium halide, and an activator comprising a precursor of europium (Eu), according to a composition ratio of the phosphor represented by Formula 1 below, and mixing said weighed materials in a solvent;
a second step of drying a mixture obtained from the first step in an oven at 100 to 150° C.; and a third step of performing heat treatment on the mixture dried in the second step under a condition of a mixed gas atmosphere of nitrogen and hydrogen (in volumetric ratio of 75 to 95:25 to 5) and a temperature of 1000 to 1350° C.:

  [Formula 1]

wherein in Formula 1, M represents at least one kind of metal selected from the group consisting of Mg, Ca and Ba, X represents F, Cl, Br or I, N represents at least one kind of metal selected from the group consisting of Y, La, Nd, Gd, Lu, B, Al, Ga and in, $0 \leq x \leq 14$, $0 \leq y \leq 16$, $0 \leq x+y \leq 16$, $0 < z \leq 1$, $0.9 < a \leq 6$, $3 < b \leq 24$, $0 < c \leq 8$, and $0.5 < d \leq 2$.

6. The method of claim 5, wherein the precursor is one kind or a mixture of two kinds or more selected from the group consisting of oxide, chloride, hydroxide, carbonate and superoxide of a metal.

7. The method of claim 5, wherein besides the activator, precursors of at least one kind of metals selected from the group consisting of yttrium (Y), cerium (Ce), lanthanum (La), manganese (Mn) and samarium (Sm) are further used as co-activators.

8. The method of claim 5, wherein the solvent is distilled water, a lower grade alcohol having 1 to 4 carbon atoms, or acetone.

* * * * *